(12) United States Patent
Garcia et al.

(10) Patent No.: US 7,704,033 B2
(45) Date of Patent: Apr. 27, 2010

(54) LONG AXIS COMPONENT LOADER

(75) Inventors: Doug J. Garcia, Beaverton, OR (US);
William Saunders, Tigard, OR (US);
Nick Tubbs, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1009 days.

(21) Appl. No.: 11/409,112

(22) Filed: Apr. 21, 2006

(65) Prior Publication Data

US 2007/0248442 A1 Oct. 25, 2007

(51) Int. Cl.
*B65B 21/02* (2006.01)

(52) U.S. Cl. .............. 414/416.04; 414/406.09; 221/169; 198/397.04; 198/397.05

(58) Field of Classification Search .......... 221/169, 221/170; 198/397.04, 397.05; 414/403, 414/415, 416.04, 416.09
See application file for complete search history.

(56) References Cited

U.S. PATENT DOCUMENTS

| | | | | |
|---|---|---|---|---|
| 2,273,782 A | * | 2/1942 | Irwin | 221/169 |
| 3,295,659 A | * | 1/1967 | Aidlin | 198/397.05 |
| 4,154,329 A | * | 5/1979 | Hildenbrand | 198/392 |
| 4,411,350 A | | 10/1983 | Wolfram | |
| 4,479,573 A | * | 10/1984 | Ackley et al. | 198/399 |
| 5,394,973 A | | 3/1995 | Emmart et al. | |
| 5,568,870 A | | 10/1996 | Utech | |
| 5,842,579 A | | 12/1998 | Garcia et al. | |
| 5,863,331 A | | 1/1999 | Braden et al. | 118/261 |
| 5,984,079 A | * | 11/1999 | Garcia | 198/397.02 |
| 6,194,679 B1 | | 2/2001 | Garcia | |
| 6,227,345 B1 | * | 5/2001 | Miyamoto | 198/392 |
| 6,906,508 B1 | | 6/2005 | Saulnier | |
| 7,161,346 B2 | | 1/2007 | Fish | |
| 2006/0232279 A1 | | 10/2006 | Garcia et al. | |

\* cited by examiner

*Primary Examiner*—Saúl J Rodriguez
*Assistant Examiner*—Jonathan D. Snelting
(74) *Attorney, Agent, or Firm*—Young Basile

(57) ABSTRACT

A component loader for orienting a component along its long-axis for transfer to transmission means such as a carrier belt. The loader includes a rotatable load plate having an outer peripheral edge and an upper surface where the upper surface is inclined from a horizontal plane. A plurality of slots is on the upper surface, and each is located about the outer edge of the load plate. Each of the plurality of slots is sized to receive at least one chip, preferably lying with its long axis perpendicular to the rotational axis of the rotatable load plate. An outer wall conforms to the curvature of the outer peripheral edge and is mounted adjacent thereabout. A transfer slot extends axially into the upper surface of the load plate. Preferably, each transfer slot is shaped so that a chip descending into each transfer slot from a respective slot has a ninety degree rotation about the long axis. The loader can include an inner wall mounted above the plurality of slots and interior of the outer wall, also along the rotational axis of the load plate.

20 Claims, 3 Drawing Sheets

LONG AXIS COMPONENT LOADER

TECHNICAL FIELD

The present invention relates in general to a loader for loading chips into, for example, a carrier belt.

BACKGROUND

In a known apparatus and method for loading and orienting miniature components for additional processing, such as the application of solderable paste, a bulk quantity of the miniature components are placed in a vibratory bowl feeder. The feeder contains a series of gates, walls and apertures in order to create a single radial stream of components. The components are end-to-end and are in a single layer. The radial stream of components is transferred to a linear vibratory device that converts the radial stream into a linear stream of components, while maintaining the end-to-end orientation. From this device, the linear stream of components is directed to a rotating wheel having a plurality of component receiving slots in its periphery.

Due to the small size of the components, including the small differences between the width and height of the components, handling and insertion into the slots along the periphery are important. If the components are not properly oriented, subsequent processing steps can take place on inappropriate surfaces. Speed of loading is also important as higher processing speeds lower the unit price for each component. Balancing speed and accuracy is thus important.

BRIEF SUMMARY OF THE INVENTION

Embodiments of the present invention provide a way to load and orient miniature rectilinear or tubeaxial components so that they are accessible about their ends. In particular, the present invention provides an apparatus that is able to load and present components in subsequent automated processes that require each component to be manipulated about its long axis.

An embodiment of the invention provides long axis component loader. A rotatable load plate has an outer peripheral edge and an upper surface. The upper surface is inclined from a horizontal plane for supporting a plurality of chips having a long axis. A plurality of slots is on the upper surface and, each is located about the outer edge of the load plate. Each of the plurality of slots is sized to receive at least one chip lying with its long axis perpendicular to the rotational axis of the rotatable load plate. An outer wall conforms to the curvature of the outer edge of the load plate and is mounted adjacent thereabout. A transfer slot extends axially into the upper surface of the load plate on an outer end of each of the slots, and the transfer slots are adjacent the outer peripheral edge of the rotatable load plate. Each transfer slot is shaped so that a chip descending into that transfer slot from a respective slot has a ninety degree rotation about the long axis.

Another embodiment of the invention provides a long axis component loader with a rotatable load plate having an outer peripheral edge and an upper surface where the upper surface is inclined from a horizontal plane for supporting a plurality of chips. A plurality of slots is on the upper surface, and each is located about the outer edge of the load plate, and each of the plurality of slots is sized to receive at least one of the plurality of chips. An outer wall conforms to the curvature of the outer peripheral edge of the load plate and is mounted adjacent thereabout. An inner wall is mounted above the plurality of slots on a side opposed to the upper surface of the load plate and interior of the outer wall. The inner wall is also mounted along the rotational axis of the load plate. A plurality of transfer slots are associated with respective ones of the plurality of slots and located at an outer peripheral end of the slots for receiving a chip for transmission to carrier means.

Yet another embodiment of the invention provides an improvement to a machine for supplying chips to a process using a machine feed mechanism comprising a carrier belt, a rotatable feed plate including an upper exposed surface inclined against the horizontal and an outer radial edge and an outer wall conforming to the curvature of the outer radial edge and mounted adjacent thereabout. A plurality of slots is located on the upper exposed surface about the outer radial edge. Each of the plurality of slots is sized to receive at least one chip lying with its long axis perpendicular to the rotational axis of the rotatable feed plate. A transfer slot extends axially from the upper exposed surface on a outer end of respective ones of the plurality of slots. The transfer slots are adjacent the outer radial edge, and each is shaped so that a chip descending into each transfer slot from a respective slot has a ninety degree rotation about the long axis. An inner wall is mounted in contact with an upper surface of the plurality of grooves on a side opposed to the upper exposed surface. The inner wall is also mounted interior of the outer wall and along the rotational axis of the feed plate.

The inventive features of these embodiments, and other inventive features, are described in more detail below.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

The current apparatus can be difficult to set up and to operate due to the number of devices needed for loading and orientation. This can cause problems with both speed and accuracy. In addition, when the component size to be processed is changed, changeover of the apparatus to address the new size can cause complicated part changes.

Figure 1A:
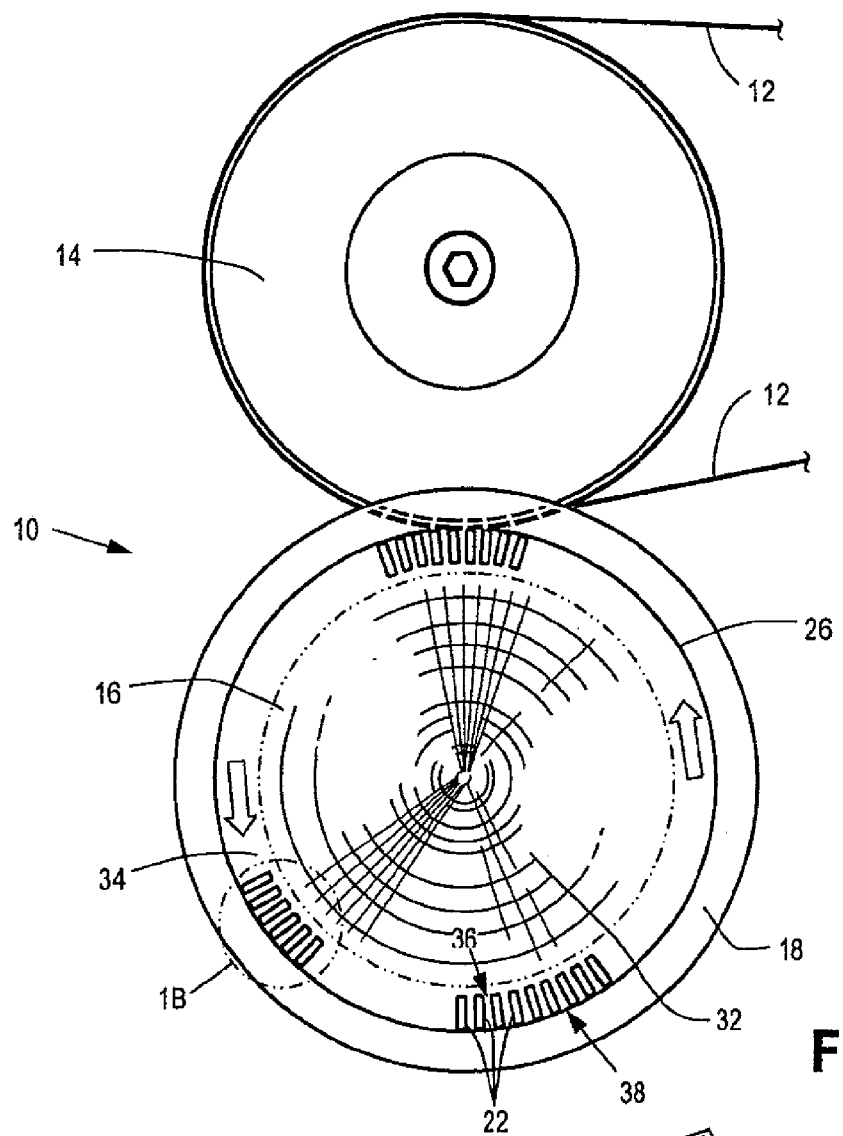
FIG. 1A is an illustrative, partial plan view of the loader in accordance with one embodiment of the present invention in relation to a carrier belt.

Embodiments of the long-axis loader taught herein respond to these problems. Inventive features of the long-axis loader are best described with reference to FIGS. 1-7. With initial reference to FIGS. 1A and 2, shown is a component loader 10 in accordance with one embodiment of the present invention in relation to transportation, in this example a carrier belt 12 mounted on a drive pulley 14. Component loader 10 broadly includes a load plate 16 mounted for rotation about an axis x-x, an outer wall 18 and preferably an inner wall 20. In order to see the details of slots 22 of load plate 16 inner wall 20 is not shown in certain figures, including FIG. 1A. Also, not all slots 22 are shown. Preferably, slots 22 extend completely around the circumference of the load plate 16.

A bulk quantity of miniature components 24, or chips, is placed in load plate 16 of component loader 10. As shown, chips 24 are rectilinear chips but chips of other shapes, such as tubeaxial chips, are possible as long as chips 24 have a long axis in comparison with any remaining axes of chip 24. With respect to chips 24 shown in FIG. 1B, the long axis is illustrated as axis y-y. The surfaces A of chips 24 perpendicular to the long axis are called the ends A hereinafter, while the surfaces of chips 24 labeled B and C are called the wide B and narrow C sides, respectively.

Load plate 16, which can be a variety of sizes, is preferably circular with an outer peripheral edge 26. Load plate 16 is supported by a base 28 mounted on a rotatable shaft 30 that rotates load plate 16 in a counter-clockwise manner in this embodiment about the axis x-x at an angle of inclination as discussed in more detail below. Rotatable shaft 30 is conventionally supported by bearings (not shown) housed in the base 28 and turns at controlled speeds by a motor drive (not shown) in a known manner.

In addition to outer peripheral edge 26, load plate 16 has an upper plate surface 32. Upper plate surface 32 can be flat or planar, but in the embodiment shown only an outer annular portion 34 containing slots 22 is flat or planar. The remainder of upper plate surface 32, at least in part, slopes from axis x-x towards outer annular portion 34. In operation, as shown in FIG. 2, component loader 10 is mounted at an angle inclined to the horizontal such that upper plate surface 32 is roughly inclined to the horizontal at an angle α. Angle α preferably ranges from 20 to 70 degrees and more preferably is about 45 degrees. Vibratory energy may be imparted to load plate 16 through the motor or by a coil and armature as is known.

Optionally, the component loader 10 includes a chip distributing ring centrally placed over upper plate surface 32 and fastened thereto. Such a ring can include a plurality of arms radiating outwardly to outer annular portion 34 of upper plate surface 32. The arms can be angled rearward from the direction of rotation of load plate 16 and base 28. Additional details of one possible chip distributing ring are shown in U.S. Pat. No. 5,863,331, issued Jan. 26, 1999, which is assigned to the assignee of the present invention and which is incorporated herein in its entirety by reference.

Outer wall 18 conforms to the curvature of outer peripheral edge 26 of load plate 16 and is mounted adjacent thereabout. Outer wall 18 is fixedly mounted to or is integral with base 28 and extends axially from base 28 to a height slightly above upper plate surface 32 of load plate 16. About the outer annular portion 34 of load plate 16 are a plurality of narrow slots 22 formed in side-by-side arrangement, each slot 22 extending from an inner slot end 36 to an outer slot end 38 co-terminus with outer peripheral edge 26 of load plate 16. The slots 22 are sized to receive a single layer of chips 24 in end-to-end orientation as discussed in more detail hereinafter. Preferably, each slot 22 can hold up to three chips 24.

Figure 1B:
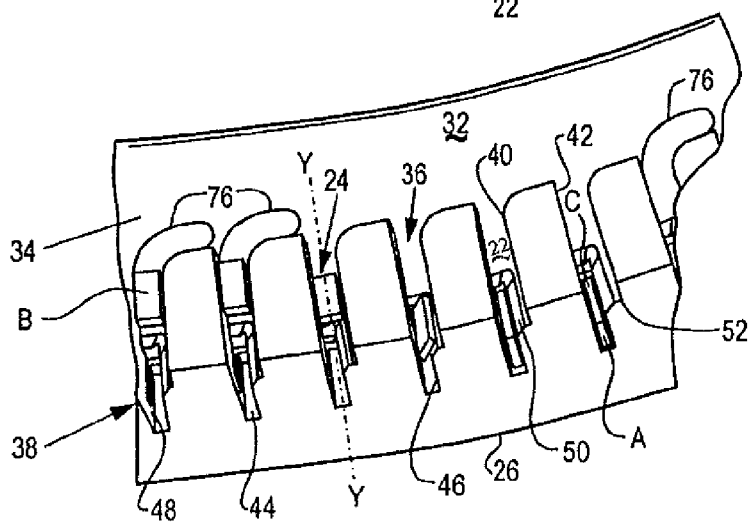
FIG. 1B is an enlarged, partial plan view of a section of the loader illustrating the positioning of the chips in slots of the loader.
Figure 2:
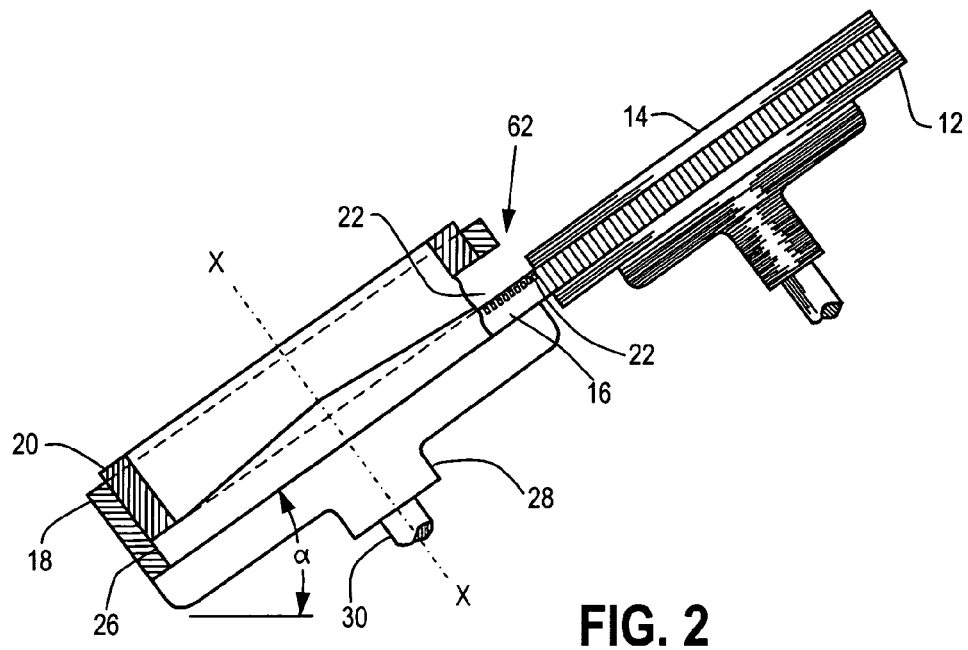
FIG. 2 is a side elevational view, partly in cross section, of the loader according to FIG. 1 in position against the carrier belt for unloading the chips from the slots of the loader to the carrier belt.

As best shown in FIG. 1B, slots 22 begin at a position raised above outer annular portion 34 of load plate 16 and extend axially into the surface of outer annular portion 34. The height above outer annular portion 34 to which slots 22 extend is preferably only slightly higher than the thickness of the narrow side C of each chip 24. Slots 22 preferably include radii and/or chamfers at inner slot end 36 to aid in the loading process. In this embodiment, inner slot end 36 incorporates a 90 degree curved radial bend at the leading edge 40 with respect to the rotation of the load plate 16, while the trailing edge 42 of each inner slot end 36 is a 90 degree corner. As shown, the width of each slot 22 is slightly wider than the width of the wide sides B of the chips 24.

As described previously, a bulk quantity of chips 24 is placed in load plate 16 of component loader 10. As rotatable shaft 30 rotates the load plate 16, slots 22 are continuously presented to the chips 24. As chips 24 become oriented in such a position that they are able to fit into inner slot end 36, namely, their long axis y-y is perpendicular to the rotational axis x-x and a wide side B is resting on outer annular portion 34 of upper plate surface 32, they load into slots 22. Due to the incline angle α of loader 10, chips 24 slide down, i.e., outward, in slots 22. As also mentioned, vibratory energy can also be used to aid in this loading. As described in for example, U.S. Pat. No. 5,863,331, a vibrator feeder/trough assembly can be incorporated and used to continuously transfer the bulk quantity of chips 24 on top of upper plate surface 32 as a function of the remaining chips 24 in the load plate 16. The number of these chips 24 can be monitored by an optical monitoring device such that when the number runs low, assembly is automatically turned on to feed more chips 24 to upper plate surface 32 of load plate 16. For more details, the reader is referred to U.S. Pat. No. 5,863,331.

Figure 3:
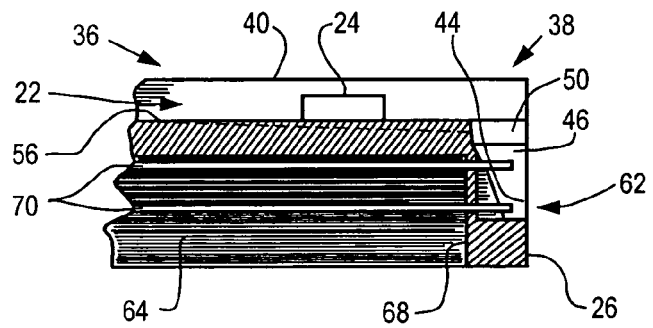
FIG. 3 is a partial cross-sectional side view of a slot according to one embodiment of the loader according to the present invention.
Figure 4:
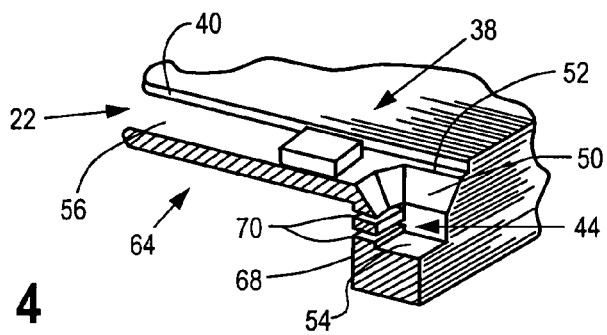
FIG. 4 is another partial cross-sectional view of the slot according to FIG. 3.

As shown in FIGS. 1B, 3 and 4, at outer slot end 38 is an additional narrow slot, called a transfer slot 44 herein, extending axially further into the surface of load plate 16 and co-terminus with outer peripheral edge 26 of load plate 16. As chips 24 reach outer slot end 38, they are rotated 90 degrees about their long axis y-y to rest in the transfer slot 44. More specifically, leading edge 40 and trailing edge 42 of each slot 22 extend radially outward to outer peripheral edge 26 of load plate 16. At outer slot end 38, transfer slot 44 descends from the bottom of slot 22 in a downward direction, preferably parallel to rotational axis x-x, and is defined by a pair of opposed, spaced-apart transfer slot side walls, leading edge wall 46 and trailing edge wall 48. Trailing edge wall 48 is preferably a continuation of trailing edge 42 of slot 22. Transfer slots 44 preferably have chamfered lead-in edges. That is, leading edge wall 46 preferably includes a chamfered edge portion 50 such that a shoulder 52 is formed between leading edge 40 of slot 22 and transfer slot 44. Although the chamfered edge portion 50 is shown extending from the leading edge wall 46 and leading edge 40 around to the rear wall between leading edge wall 46 and trailing edge wall 48, this rear wall of transfer slot 44 can extend axially directly from the bottom wall 56, i.e., without a chamfered edge.

As shown best in FIGS. 1B and 4, the width of transfer slot 44 is set such that a chip 24 can fit therein in a specific orientation, i.e., if it is oriented laying on its one narrow side C. As a chip 24 descends into slot 22, its long axis y-y is perpendicular to the rotational axis x-x and a wide side B is resting on outer annular portion 34 of upper plate surface 32. When its long axis y-y is perpendicular to the rotational axis x-x, chip 24 is said to be in long-axis orientation. As chip 24 reaches outer slot end 38, and aided by chamfered edge portion 50 of leading edge wall 46, chip 24 is rotated 90 degrees about its long axis y-y to rest at the floor 54 of transfer slot 44.

Due to the width of transfer slot 44, wide sides B are essentially parallel with leading edge wall 46 and trailing edge wall 48. Note that although the illustrated example provides that transfer slot 44 has a depth sufficient for only one chip 24, this is not required. The depth of transfer slot 44 could be sufficient to support two or more chips in long-axis orientation.

Instead of the bottom wall 56 of slot 22 being flat or planar with the outer annular portion 34 as shown, bottom wall 56 may alternately slant downward from inner slot end 36 to outer slot end 38 in a region of the transfer slot 44 as shown in dotted outline in FIG. 3. Such a slanted bottom wall would provide additional aid to gravity in moving chips 24 along respective slots 22. As shown in FIGS. 1 B and 5 in another option, instead of the bottom wall 56 of slot 22 being flat or planar with the outer annular portion 34, the bottom wall 56 of slot 22 could be sunk, i.e., cut down, into the surface of the outer annular portion 34, forming a path 76 that extends from each slot 22 in a direction of rotation of the upper plate surface 32. (Note that not all slots 22 in FIG. 1B show the path 76 for clarity.) The path 76 extends from the inner slot end 36 and follows along the curve of the leading edge 40 to stop at a position just short of the lagging edge 42 of the adjacent slot 22. The small cut into the surface forms the path 76 wide enough for the chip to freely pass through it, but the path 76 only has a slight depth with reference to the chip 24, around 0.005". This makes the path 76 deep enough to provide some guidance for orientation of the chip 24, but not so deep such that the chip 24 needs to navigate another obstacle.

Figure 5:
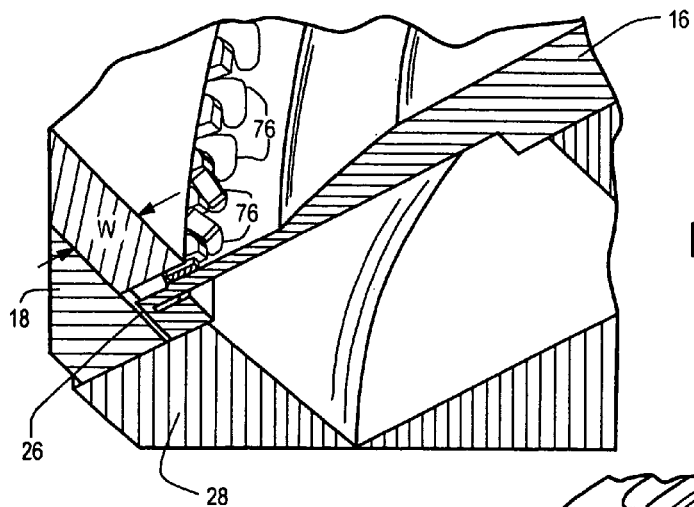
FIG. 5 is a partial cross-sectional view of one example of an inner wall configuration in relation to the loading area of the loader.
Figure 6:
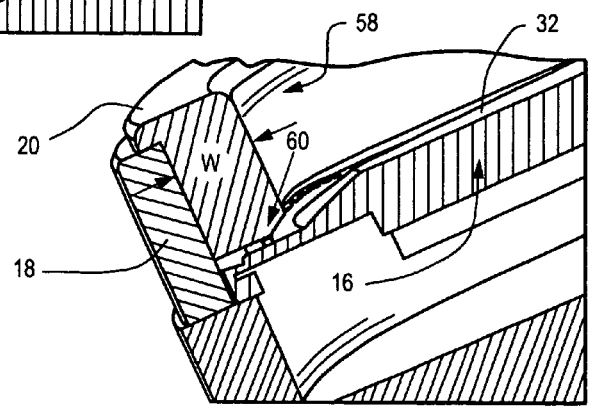
FIG. 6 is a partial cross-section view of another example of the inner wall configuration in relation to the loading area of the loader.
Figure 7:
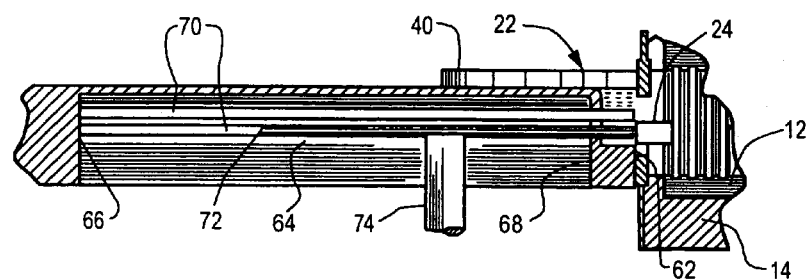
FIG. 7 is a partial cross-sectional elevation view of one possible means for moving the chip from a slot of the loader to the carrier belt according to FIG. 1 A.

FIGS. 5 and 6 show possible configurations of inner wall 20. Like outer wall 18, inner wall 20 conforms to the curvature of outer peripheral edge 26 of load plate 16. Unlike outer wall 18, however, inner wall 20 is not mounted adjacent thereabout. Instead, inner wall 20 is removably mounted interior to outer wall 18 and rests on the tops of leading edges 40 and trailing edges 42 of slots 22 and extends axially above load plate 16 to a height at or above outer wall 18. The width w of inner wall 20 extends radially inward to at least in part cover slots 22. Inner wall 20 provides a place at the lower elevation of load plate 16 where an inventory of chips 24 can collect but still be prevented from spilling off of upper plate surface 32. At a minimum the inner wall 20 has a width w sufficient to cover transfer slot 44. In the embodiment shown in FIG. 5, inner wall 20 covers only a portion of slot 22 such that entrance to slot 22 at inner slot end 36 is visible. An alternate embodiment is shown in FIG. 6. In this embodiment, extended component trapping exists in that inner wall 20 extends beyond the entrance of slot 22 at inner slot end 36 such that the entire slot length is covered by inner wall 20. Inner peripheral surface 58 of inner wall 20 also includes an optional chamfered edge 60. According to these embodiments, inner diameter of inner wall 20 (inner peripheral surface 58) and upper plate surface 32 of load plate 16 serve to contain and partially orient chips 24.

Referring again to FIG. 2, outer peripheral edge 26 of load plate 16 has an aperture 62 formed therein and arranged in vertical alignment with transfer slot 44. Aperture 62 is of a size and shape as to allow one chip 24 to pass radially outward therethrough in long-axis orientation, but could be of a size and shape to allow more than one chip 24 to pass therethrough where chips 24 are in long-axis orientation and juxtaposed narrow side C to narrow side C.

As mentioned briefly above, component loader 10 is designed to pass chips 24 in a known orientation to transportation means for additional processing. Additional processing can include any number of processes performed by a machine such as, for example, the termination machine disclosed in U.S. Pat. No. 5,226,382. In the embodiment disclosed herein, the transportation means is a carrier tape or belt 12 including chip-holding slots in a mask (not shown). Carrier belt 12 is passed over drive pulley 14 as shown in FIG. 1A and is arranged to come into aligned position adjacent outer peripheral edge 26 of component loader 10 as shown in FIG. 2 so that each chip-holding slot in carrier belt 12 is aligned with aperture 62. In operation, the rotational speeds of component loader 10 and of carrier belt 12 are controlled so that alignment is maintained between each successive chip-holding slot with each successive aperture 62. Where the load plate 16 is mounted for counter-clockwise rotation, drive pulley 14 supporting carrier belt 12 rotates clockwise. For additional details of carrier belt 12, the reader is again referred to U.S. Pat. No. 5,863,331.

A variety of transfer means as disclosed in detail in U.S. Pat. No. 5,863,331 is possible for inclusion to transfer chips 24 from the component loader 10 to carrier belt 12, or other transportation means. One possible transfer means is shown by example in FIG. 7. A wide lower groove 64 is formed in load plate 16 opposed to exposed upper plate surface 32. Groove 64 is inboard of transfer slot 44 and is bounded by an inner groove wall 66 and an outer groove wall 68. At least one slot 70 extends from outer groove wall 68 into transfer slot 44 as shown. Chip 24 is moved from its position in transfer slot 44 radially outward to carrier belt 12 through the use of slot(s) 70. More specifically, at least one very thin, small diameter transfer disk 72 is mounted on a shaft 74 in which disk(s) 72 pass through into transfer slot 44 using slot(s) 70. The circumferential velocity of load plate 16 and the circumferential velocity of disk(s) 72 are controlled and coordinated so that there is little or no difference in perimeter velocity therebetween. As a transfer slot 44 arrives opposite chip-holding slot of carrier belt 12, disk(s) 72 have already penetrated transfer slot 44 through slot(s) 70 and urged chip(s) 24 from transfer slot 44 radially outward through aperture 62 into the chip-holding slot. In this manner, transfer slot 44 is emptied. Transfer slot 44 then proceeds counter-clockwise with load plate 16 back around and down to the lower end of load plate 16 where chips 24 are waiting for their pickup into transfer slot 44.

As mentioned, more than one chip 24 can be included in transfer slot 44. To simultaneously empty these chips 24 from transfer slot 44, more than one slot 70 can be mounted in common on shaft 74 in close, spaced-apart parallel proximity to each other such that disks 72 corresponding in number to slots 70 urge chips 24 from transfer slot 44 radially outward through aperture 62 to carrier belt 12.

The above-described embodiments have been described in order to allow easy understanding of the present invention, and do not limit the present invention. On the contrary, the invention is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A long axis component loader, comprising:
   a single rotatable load plate having an outer peripheral edge and an upper surface, the upper surface inclined from a horizontal plane for supporting a plurality of elongate chips having a long axis;
   a plurality of slots on the upper surface and located about the outer edge of the load plate, each of the plurality of slots sized to receive at least one elongate chip lying with its long axis perpendicular to the rotational axis of the rotatable load plate and lying with its long axis in parallel with a radius of the rotatable load plate;

an outer wall conforming to the curvature of the outer edge of the load plate and mounted adjacent thereabout; and a transfer slot extending axially into the upper surface of the load plate on a outer end of respective ones of the plurality of slots and adjacent the outer peripheral edge of the rotatable load plate, each transfer slot shaped so that an elongate chip descending into each transfer slot from a respective slot has a ninety degree rotation about the long axis.

2. The long axis component loader according to claim 1, further comprising:

an inner wall mounted above at least some of the plurality of slots on a side opposed to the upper surface of the load plate and interior of the outer wall, the inner wall mounted about the rotational axis of the load plate; and wherein each transfer slot has a radial length at least as long as the long axis of the chip and forms an opening in the outer edge of the load plate; and the outer wall faces at least some of the openings of the transfer slots.

3. The long axis component loader according to claim 1, further comprising:

an inner slot end of at least one of the plurality of slots including at least one of a radius and a chamfer to aid in loading respective chips.

4. The long axis component loader according to claim 1, further comprising:

a chamfered surface extending between a leading edge of a slot of the plurality of slots and a leading edge of a respective transfer slot.

5. The long axis component loader according to claim 4 wherein a lagging edge of the slot of the plurality of slots has a ninety degree angle with respect to the upper surface of the rotatable test plate.

6. The long axis component loader according to claim 1 wherein the upper surface of the load plate slopes at least in part from the rotational axis to an outer annular portion of the upper surface, the plurality of slots located about the outer annular portion.

7. The long axis component loader according to claim 1, further comprising:

an aperture in the outer peripheral edge formed by each transfer slot; and at least one rotatable transfer disk adapted to enter a respective narrow slot extending from a lower groove in the load plate interior of each transfer slot into the respective transfer slot to push a chip outward from the respective transfer slot through the aperture.

8. The long axis component loader according to claim 1 wherein each of the plurality of slots is formed between two radially-extending plate portions that rise above the upper surface of the load plate in an axial direction and each of the plurality of slots including a leading edge with respect to a direction of rotation of the load plate formed by a first one of the two radially-extending plate portions and a trailing edge with respect to the direction of rotation of the load plate formed by a second one of the two radially-extending plate portions; and wherein the leading edge and the trailing edge form an opening for the transfer slot.

9. The long axis component loader according to claim 8, further comprising:

an inner wall mounted adjacent an upper surface of the leading edge and the trailing edge of certain ones of the plurality of slots on a side opposed to the upper surface of the load plate, the inner wall mounted interior of the outer wall and about the rotational axis of the load plate; and wherein each slot has a radial length sufficient to support at least two chips lying with their respective long axis perpendicular to the rotational axis of the load plate; and the inner wall faces openings formed by each of the leading edge and the trailing edge of the certain ones of the plurality of slots and has a width at least as large as a radial length of the openings.

10. The long axis component loader according to claim 8 wherein each transfer slot comprises a leading edge wall and a trailing edge wall wherein the trailing edge wall is a continuation of the trailing edge and the leading edge wall includes a sloped portion and a straight portion extending axially into the upper surface of the load plate, the straight portion having a width narrower than a width of a respective slot and the sloped portion extending to the straight portion from the leading edge or from a shoulder spaced apart from the leading edge.

11. A long axis component loader, comprising:

a single rotatable load plate having an outer peripheral edge and an upper surface, the upper surface inclined from a horizontal plane for supporting a plurality of elongate chips;

a plurality of slots on the upper surface and located about the outer edge of the single rotatable load plates, each of the plurality of slots formed between two radially-extending plate portions that rise above the upper surface of the single rotatable load plate in an axial direction and each of the plurality of slots including a leading edge with respect to a direction of rotation of the single rotatable load plate formed by a first one of the two radially-extending plate portions and a trailing edge with respect to the direction of rotation of the single rotatable load plate formed by a second one of the two radially-extending plate portions;

an outer wall conforming to the curvature of the outer peripheral edge of the single rotatable load plate and mounted adjacent about at least a portion of the outer peripheral edge;

an inner wall mounted facing at least certain ones of the plurality of slots on a side opposed to the upper surface of the single rotatable load plate and interior of the outer wall; and a plurality of transfer slots, each having an opening formed by the leading edge and a trailing edge of respective ones of the plurality of slots and located at an outer peripheral end thereto for receiving an elongate chip for transmission to carrier means, the plurality of transfer slots extending axially into the single rotatable load plate, having a width narrower than a width of the plurality of slots and co-terminus with the outer peripheral edge of the single rotatable load plate; and wherein each of the plurality of slots is sized to receive at least one of the plurality of elongate chips lying with a long axis perpendicular to the rotational axis of the single rotatable load plate and with the long axis in parallel with a radius of the single rotatable plate; and each of the plurality of transfer slots is shaped so that the elongate chip descending into a respective transfer slot from a respective slot has a ninety degree rotation about the long axis.

12. The long axis component loader according to claim 11, further comprising:

a chamfered surface extending between a leading edge of the respective slot and a leading edge of the respective transfer slot.

13. The long axis component loader according to claim 11, further comprising:
transfer means for transferring chips from a respective transfer slot to carrier means.

14. The long axis component loader according to claim 11, further comprising:
an inner surface of the inner wall extending radially from the outer wall for a distance greater than a radial length of the transfer slot.

15. The long axis component loader according to claim 14 wherein the distance is greater than a radial length of the plurality of slots.

16. The long axis component loader according to claim 15, further comprising:
a chamfered surface between the inner surface of the inner wall and a bottom surface of the inner wall adjacent the plurality of slots.

17. The long axis component loader according to claim 11 wherein each transfer slot comprises a leading edge wall and a trailing edge wall wherein the trailing edge wall is a continuation of the trailing edge and the leading edge wall includes a sloped portion and a straight portion, the sloped portion extending to the straight portion from the leading edge or from a shoulder spaced apart from the leading edge; and wherein each transfer slot has a bottom surface having a radial length at least as long as the long axis.

18. In a machine for supplying chips to a process using a machine feed mechanism comprising a carrier belt, the improvement comprising: a single rotatable load plate including an upper exposed surface inclined against the horizontal and an outer radial edge and an outer wall conforming to the curvature of at least a portion of the outer radial edge and mounted adjacent thereabout;
a plurality of slots located on the upper exposed surface about the outer radial edge, each of the plurality of slots sized to receive at least one elongate chip lying with its long axis perpendicular to the rotational axis of the rotatable feed plate and with its long axis in parallel with a radius of the rotatable feed plate;
a transfer slot extending axially from the upper exposed surface on a outer end of respective ones of the plurality of slots and forming an opening in the outer radial edge, at least certain of the openings facing an inner surface of the outer wall, and each transfer slot shaped so that an elongate chip descending into each transfer slot from a respective slot has a ninety degree rotation about the long axis; and
an inner wall mounted facing an upper surface of the plurality of slots on a side opposed to the upper exposed surface, the inner wall mounted interior of the outer wall and along the rotational axis of the feed plate.

19. In the machine according to claim 18, the improvement further comprising:
the upper exposed surface sloping at least in part from the rotational axis to the outer radial edge.

20. In the machine according to claim 18 wherein each of the plurality of slots is formed between two radially-extending plate portions that rise above the upper exposed surface in an axial direction;
each of the plurality of slots includes a leading edge with respect to a direction of rotation of the rotatable feed plate formed by a first one of the two radially-extending plate portions and a trailing edge with respect to the direction of rotation of the rotatable feed plate formed by a second one of the two radially-extending plate portions; and
each transfer slot includes a leading edge wall and a trailing edge wall, the trailing edge wall being a continuation of the trailing edge and the leading edge wall being a continuation of the leading edge and having at least a portion with a width narrower than a width of a respective slot.

* * * * *